United States Patent [19]

Tomiyasu et al.

[11] Patent Number: 5,182,183
[45] Date of Patent: Jan. 26, 1993

[54] POSITIVE PHOTOSENSITIVE PLANOGRAPHIC PRINTING PLATES CONTAINING SPECIFIC HIGH-MOLECULAR WEIGHT COMPOUND AND PHOTOSENSITIVE ESTER OF O-NAPTHOQUINONEDIAZIDOSULFONIC ACID WITH POLYHYDROXYBENZOPHENONE

[75] Inventors: Hiroshi Tomiyasu, Tokyo; Yoshiko Kobayashi, Yokohama; Kiyoshi Goto, Tokyo; Takeshi Yamamoto; Hideyuki Nakai, both of Tokyo, all of Japan

[73] Assignees: Mitsubishi Kasei Corporation; Konica Corporation, both of Tokyo, Japan

[21] Appl. No.: 789,550

[22] Filed: Nov. 8, 1991

Related U.S. Application Data

[63] Continuation of Ser. No. 508,531, Apr. 12, 1990, abandoned, which is a continuation of Ser. No. 167,107, Mar. 11, 1988, abandoned.

[30] Foreign Application Priority Data

| Mar. 12, 1987 | [JP] | Japan | 62-57282 |
| May 7, 1987 | [JP] | Japan | 62-111413 |
| May 18, 1987 | [JP] | Japan | 62-120592 |
| Jun. 3, 1987 | [JP] | Japan | 62-139140 |

[51] Int. Cl.$^5$ .................... G03F 7/023; G03C 1/61
[52] U.S. Cl. ..................... 430/165; 430/191; 430/192; 430/193; 430/302; 430/326; 430/165
[58] Field of Search ............. 430/192, 191, 193, 302, 430/326, 165

[56] References Cited

U.S. PATENT DOCUMENTS

| 3,046,118 | 7/1962 | Schmidt | 430/193 |
| 3,106,465 | 10/1963 | Neugebauer et al. | 430/193 |
| 3,148,983 | 9/1964 | Endermann et al. | 430/193 |
| 3,201,239 | 8/1965 | Neugebauer et al. | 430/302 |
| 3,859,099 | 1/1975 | Petropoulos et al. | 430/191 |
| 3,868,254 | 2/1975 | Wemmers | 430/191 |
| 3,890,152 | 6/1975 | Ruckert et al. | 430/175 |
| 4,009,033 | 2/1977 | Bakos et al. | 430/191 |
| 4,036,644 | 7/1977 | Kaplan et al. | 430/191 |
| 4,307,173 | 12/1981 | Gventer | 430/192 |
| 4,409,314 | 10/1983 | Buhr et al. | 430/326 |
| 4,442,195 | 4/1984 | Yamamoto et al. | 430/192 |
| 4,467,025 | 8/1984 | Goto et al. | 430/191 |
| 4,467,027 | 8/1984 | Yamamoto et al. | 430/302 |
| 4,719,167 | 1/1988 | Miura et al. | 430/193 |
| 4,725,523 | 2/1988 | Miura et al. | 430/192 |
| 4,725,526 | 2/1988 | Frass et al. | 430/191 |
| 4,731,316 | 3/1988 | Tomiyasu et al. | 430/175 |

FOREIGN PATENT DOCUMENTS

| 52-28401 | 7/1977 | Japan |  |
| 60-88942 | 5/1985 | Japan |  |
| 62-279327 | 12/1987 | Japan | 430/192 |

OTHER PUBLICATIONS

English Abstract of Japanese Pub. #52-28,401, Published Jul. 26, 1977.
English Abstract of Japanese Pub. #60-88,942, Published May 18, 1985, (Fuji Photo Film).
English language Abstract of Jap. Pub. #51-33,620, Published Mar. 22, 1976 (Konishiroka Photo.).
English language Abstract of Jap. Pub. #77-34,931, Published Sep. 6, 1977. (Konishiroka Photo.).
J. Kosar: "Light-Sensitive Systems", 1965, John Wiley & Sons, pp. 351 formula 2.
IBM Technical Disclosure Bullentin, vol. 25, No. 3A, Aug. 1982, pp. 983 A. L. Thayer, Jr., "Contrast enhancement in positive working resist systems".
Research Disclosure, No. 149, Set. 1976, pp. 27–29, ref No. 14929, "Photoresists containing quinone diazides."

*Primary Examiner*—Charles L. Bowers, Jr.
*Assistant Examiner*—Christopher G. Young
*Attorney, Agent, or Firm*—Oblon, Spivak, McClelland, Maier & Neustadt

[57] ABSTRACT

A positive photosensitive planographic printing plate is disclosed which has a photosensitive layer comprising in combination a specific o-naphthoquinonediazidosulfonic ester and a resin having a specific structural unit(s). Said photosensitive layer may also contain a novolak resin and/or an organic acid.

17 Claims, No Drawings

POSITIVE PHOTOSENSITIVE PLANOGRAPHIC PRINTING PLATES CONTAINING SPECIFIC HIGH-MOLECULAR WEIGHT COMPOUND AND PHOTOSENSITIVE ESTER OF O-NAPTHOQUINONEDIAZIDOSULFONIC ACID WITH POLYHYDROXYBENZOPHENONE

This application is a continuation of application Ser. No. 07/508,531, filed on Apr. 12, 1990, now abandoned, which is a continuation of Ser. No. 07/167,107, filed Mar. 11, 1988, now abandoned.

FIELD OF INDUSTRIAL UTILIZATION

The present invention relates to a positive photosensitive planographic printing plate. More particularly, the invention relates to said type of planographic printing plate having a photosensitive layer comprising in combination a specific o-naphthoquinonediazidosulfonic ester and a resin having specific structural units. Said photosensitive layer may contain a novolak resin and/or an organic acid.

PRIOR ART

Generally, positive photosensitive planographic printing plate is specified by having on a hydrophilic support an ink receptive photosensitive layer which is solubilized upon exposure. When this photosensitive layer is exposed to an image and developed, the non-image area of the layer is removed, with the image area alone being left, to form the image on the plate. Printing by use of this printing plate is conducted by taking advantage of the difference in properties between the image area and the non-image area, the former being lipophilic and the latter hydrophilic.

Generally, planographic printing plates are required to have such properties as high printing durability, chemical resistance, great latitude in development, good ink receptivity and high sensitivity. Especially the positive type needs to have exceptionally high chemical resistance, excellent printing durability and great latitude in development. The term "chemical resistance" used here refers to the resistance to various types of chemicals used in printing operations, such as isopropyl alcohol, ink, affinitising solution and plate cleaner.

o-Naphthoquinonediazido compounds are popularly used for the photosensitive layer. Since these compounds, however, are not polymeric compounds, they are usually mixed or condensation reacted with novolak resins, etc. to elevate the mechanical strength. As an example of resin-conjugated o-naphthoquinonediazido compounds, o-naphthoquinonediazidosulfonic esters of polycondensed resin of pyrogallol and acetone are disclosed in Japanese Patent Publication (Kokoku) No. 28403/68. The photosensitive layer using such esters shows a relatively good performance, but in case ordinary novolak resins such as m-cresol novolak resin are used as binder for said esters, the formed photosensitive layer proves to be unsatisfactory in printing durability particularly when UV ink is used for printing.

In order to further improve printing durability, chemical resistance and other properties mentioned above, there have been proposed photosensitive compositions containing various types of photosensitive materials and binders.

The photosensitive composition disclosed in Japanese Patent Application Laying-Open (Kokai) No. 76346/80 contains a photosensive resin obtained by condensing a polyhydroxyphenyl compound prepared from co-condensation polymerization of resorcinol or its derivative, pyrogallol and acetone and an o-quinonediazido compound having halogenosulfonyl group, and an alkali-soluble resin such as phenol-formaldehyde resin as binder. The photosensitive composition disclosed in Japanese Patent Publication (Kokoku) No. 54621/81 contains an o-quinonediazido compound as photosensitive material and a resin obtained by co-condensing phenol, mixed m- and p-cresol and aldehyde as binder. Since novolak resin is still used as binder in these photosensitive compositions, the photosensitive layer formed by using such compositions is low in film strength at the image area and also poor in printing durability.

As a means for improving printing durability, a so-called burning treatment is generally employed in which the photosensitive layer is subjected to high-temperature heating after exposure and development. This burning treatment, however, has the problem that, at the time of heating, the monomer component of resin might run out from the photosensitive layer at the image area and deposit on the non-image area to cause scumming at the time of printing.

The photosensitive composition disclosed in Japanese Patent Publication (Kokoku) No. 28401/77 contains a photosensitive material composed of an o-naphthoquinonediazidosulfonic acid derivative and a binder composed of an acrylic high-molecular weight compound having the structural unit represented by the following general formula:

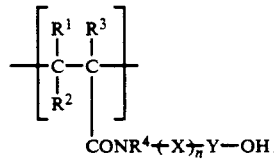

wherein $R^1$ and $R^2$ each represent a hydrogen atom or an alkyl or carboxyl group, $R^3$ represents a hydrogen atom, a halogen atom or an alkyl group, $R^4$ represents a hydrogen atom or an alkyl, a phenyl or an aralkyl group, X represents a divalent organic group connecting the nitrogen atom and the aromatic ring carbon atom, n is 0 or 1, and Y represents an optionally substituted phenylene or naphthylene group. Since a polymeric compound having said structural unit is used instead of novolak resin as binder in this photosensitive composition, the photosensitive layer formed by using such composition has high film strength and good printing durability.

Other prior art techniques may be found in EP-A-0179948 which discloses a photosensitive planographic printing plate comprising an aluminium or aluminium alloy plate having an anodic oxidation layer obtained by the anode oxidation in an electrolyte of phosphoric acid or in an electrolyte of mixed acid but containing the phosphoric acid as a main component, and a layer of photopolymerizable photosensitive composition overlaid on the Al or Al alloy plate and containing a polymer binder having a carboxylic acid residue or carboxylic acid anhydride residue, an addition polymerizable unsaturated compound and a photo-polymerization initiator, and EP-A-0177962 which discloses a photosensitive composition comprising: (a) a photosensitive diazo resin represented by the following general formula (A):

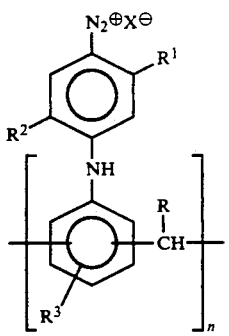

(A)

wherein $R^1$, $R^2$ and $R^3$ each represents a hydrogen atom, an alkyl or an alkoxy group, R represents a hydrogen atom, an alkyl or a phenyl group, X represents $PF_6$ or $BF_4$ and n represents a number of 1 to 200, in which a resin with the number n in the above formula being 5 or more is contained by more than 20 mol %, (b) an oleophilic high molecular compound with hydroxyl group, and (c) a high molecular organic acid without hydroxyl group, and in which the content of the ingredient (c) is from 1.5 to 30% by weight based on the solid matter in said composition, said photosensitive composition being able to provide a photosensitive layer having high sensitivity and being excellent in storage stability and developability as well as excellent in the film strength. These photosensitive compositions, however, are different from the composition used for the photosensitive layer of this invention in their respective ingredients involved etc.

PROBLEMS TO BE SOLVED BY THE INVENTION

The positive photosensitive planographic printing plate having a photosensitive layer composed of the photosensitive composition of Japanese Patent Publication (Kokoku) No. 28401/77 has relatively high printing durability and chemical resistance in an ordinary style of printing, but it was found that such printing plate was still unsatisfactory for UV printing. It was also observed that this printing plate had narrow latitude in development. "UV printing" herein refers to printing carried out by using an ink containing an ultraviolet absorber (UV ink). Unsuitability of said printing plate for UV printing was found due to low chemical resistance or high susceptibility of the photosensitive layer to the ink and chemicals used in UV printing.

The present inventors have pursued their studies directed to the obtainment of a photosensitive composition which is well appliable to UV printing and improved in latitude in development and also shows excellent ball pen performance.

The "ball pen performance" referred to in this specification is defined as follows; When printing original films on a photosensitive planographic printing plate successively by changing the printing position (so-called multiple printing), it may be necessitated to mark the film positions on the photosensitive layer for correct positioning of the respective original films. Usually an oleaginous ball pen is used as marking means. In this case, if the solvent of the ink used for the ball pen is an organic solvent, especially a high-boiling point one such as glycols, the photosensitive layer composed of a photosensitive composition in the photosensitive planographic printing plate may be corroded and dissolved by the ink. In case the marked position coincides with the image area, the photosensitive layer at the marked part of the image area may be removed in the course of development and the marks might inconveniently be reproduced on the prints. The resistant quality against corrosion by the ball pen ink is called "ball pen performance", and a photosensitive composition having such ball pen performance has been desired.

An object of the present invention is to provide a positive photosensitive planographic printing plate having extremely high chemical resistance, well appliable to UV ink printing with no need of burning treatment and also having excellent printing durability.

Another object of the present invention is to provide a positive photosensitive planographic printing plate having high sensitivity and broad latitude in development.

Still another object of the present invention is to provide a positive photosensitive planographic printing plate having excellent ball pen performance.

MEANS FOR SOLVING THE PROBLEMS

The assiduous studies carried out by the present inventors for eliminating the above-mentioned defects of conventional photosensitive compositions have led to the striking finding that the use of specific low-molecular weight derivatives of an o-naphthoquinonediazidosulfonic acid, more specifically an o-naphthoquinonediazidosulfonic ester of a polyhydroxybenzophenone as photosensitive material enables obtainment of a positive photosensitive planographic printing plate showing excellent chemical resistance and printing durability in UV printing and also having great latitude in development and splendid ball pen performance The present invention was achieved on the basis of such finding.

The positive photosensitive planographic printing plate provided according to this invention is characterized by having on a support a photosensitive layer containing:

(A) an o-naphthoquinonediazidosulfonic ester of a polyhydroxybenzophenone, and (B) a high-molecular weight compound containing the structural units represented by the following general formula (I):

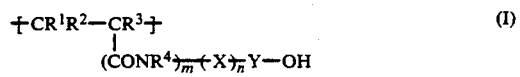

(I)

wherein $R^1$ and $R^2$ represent independently a hydrogen atom, a halogen atom or an alkyl, an aryl or a carboxyl group, $R^3$ represents a hydrogen atom, a halogen atom or an alkyl or an aryl group, $R^4$ represents a hydrogen atom or an alkyl, an aryl or an aralkyl group, Y represents an aromatic group which may have substituent(s), X represents a divalent organic group linking the nitrogen atom and the carbon atom of said aromatic group, m represents an integer of 0 or 1, and n represents an integer from 0 to 5.

The present invention will be described in further detail below.

The polyhydroxybenzophenones used in this invention in the form of their o-naphthoquinonediazidosulfonic esters (A) are those compounds in which at least two hydrogen atoms of benzophenone are substituted with hydroxyl groups, or derivatives thereof. Examples of such compounds are dihydroxybenzophenones, trihydroxybenzophenones, tetrahydroxybenzophenones, pentahydroxybenzophenones and octahydroxybenzophenones, and examples of the derivatives thereof are those derivatives in which the phenyl nucleus is substituted with halogen atom(s), alkyl group(s), aryl group(s), aralkyl group(s) and carboxyl group(s). Among these compounds, trihydroxybenzophenones and tetrahydroxybenzophenones are preferred. 2,3,4-trihydroxybenzophenone and 2,3,4,4'-tetrahydroxybenzophenone are most preferred.

Examples of the o-naphthoquinonediazidosulfonic acids used in this invention in the form of their o-napthoquinone-diazidosulfonic ester are 1,2-naphthoquinone-2-diazido-5-sulfonic acid, 1,2-naphthoquinone-2-diazido-4-sulfonic acid, and 1,2-naphthoquinone-2-diazido-6-sulfonic acid.

The o-naphthoquinonediazidosulfonic esters of polyhydroxybenzophenones can be synthesized by the conventional methods. Usually a polyhydroxybenzophenone and the acid chloride of an o-naphthoquinonediazidosulfonic acid are reacted in the presence of a catalyst such as an alkali carbonate or triethylamine.

The substantial condensation rate in said esters (the rate of o-naphthoquinonediazidosulfonic acid bonded to one hydroxyl group of polyhydroxybenzophenone) is preferably in the range of 30 to 100%, more preferably 40 to 99%, even more preferably 50 to 98%. When said substantial condensation rate is too low, the composition tends to be lowered in ball pen performance. When said condensation rate is too high, the synthesis of the esters tends to be very difficult.

The amount of said component (A) in the composition constituting the photosensitive layer is preferably in the range of 5 to 50% by weight, more preferably 10 to 40% by weight. When the amount of (A) is below said ranged, the composition tends to be lowered in ball pen performance. When it exceeds said range, the composition tends to be lowered in sensitivity.

In the present invention, it is of course possible to add where necessary other esters than those of polyhydroxybenzophenones as photosensitive material within the limits not prejudicial to the intended effect of the invention. For example, known esters such as esterified products of pyrogallol-acetone resin, resorcin-benzaldehyde resin, and cresol resin, having a molecular weight of about 500 to 5,000 can be contained in an amount range below 50% by weight in the photosensitive composition of the present invention.

The high-molecular weight compound used as component (B) of the photosensitive layer composition according to this invention is selected from the high-molecular weight compounds containing the structural unit represented by the following general formula (I):

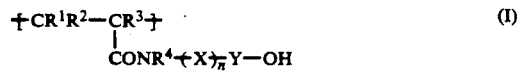
(I)

wherein $R^1$ and $R^2$ represent independently a hydrogen atom, a halogen atom, an alkyl, ar aryl or a carboxyl group, $R^3$ represents a hydrogen atoms, a halogen atom, an alkyl or an aryl group, $R^4$ represents a hydrogen atom, an alkyl, an aryl or an aralkyl group, Y represents an aromatic group which may have substituent(s), X represents a divalent organic group linking the nitrogen atom and the carbon atom of said aromatic group, and n represents an integer from 0 to 5. Such compounds may be either homopolymers having recurrence of said structural units alone or copolymers having one or more monomer units besides said structural units.

In the shown formula (I) of said structural units, $R^1$ and $R^2$ each represent preferably a hydrogen atom, an alkyl group such as methyl or ethyl, or a carboxyl group. More preferably both of them represent a hydrogen atom. $R^3$ represents preferably a hydrogen atom, a halogen atom such as bromine or chlorine atom, or an alkyl group such as methyl or ethyl. More preferably it represents a hydrogen atom or a methyl group. $R^4$ represents preferably a hydrogen atom or an alkyl group such as methyl or ethyl, a hydrogen atom being most preferred. Y represents preferably a phenylene or naphthylene group which may have substituent(s). Examples of such substituents are an alkyl group such as methyl or ethyl, a halogen atom such as bromine or chlorine atom, a carboxyl group, an alkoxyl group such as methoxy or ethoxy, a hydroxyl group, a sulfonic acid group, a cyano group, a nitro group and an acyl group. More preferably Y represents a phenylene or naphthylene group which is non-substituted or substituted with methyl group(s). X represents a divalent organic group linking the nitrogen atom and the carbon atom of the aromatic group, preferably an alkylene group. n is a number of 0 to 5, preferably 0 to 3, more preferably 0.

In the high-molecular weight compounds of this invention having a copolymer type structure, the monomer units usable in combination with the structural units of the above-shown formula (I) may be vinyl monomers of various types, for example, ethylenic unsaturated olefins such as ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as itaconic acid, maleic acid and maleic anhydride; α-methylene aliphatic monocarboxylic acid esters such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate and ethyl methacrylate; nitriles such as acrylonitrile and methacrylonitrile; amides such as acrylamide; anilides such as acrylanilide, p-chloroacrylanilide, m-nitroacrylanilide and m-methoxyacrylanilide; vinyl esters such as vinyl acetate, vinyl propionate, vinyl benzoate and vinyl butyrate; vinyl ethers such as methyl vinyl ether, ethyl vinyl ether, isobutyl vinyl ether and β-chloroethyl vinyl ether; vinyl chloride, vinylidene chloride, vinylidene cyanide, and ethylene derivatives such as 1-methyl-1'-methoxyethylene, 1,1'-dimethoxyethylene, 1,2-dimethoxyethylene, 1,1'-dimethoxycarbonylethylene and 1-methyl-1'-nitroethylene; N-vinyl compounds such as N-vinylpyrrole, N-vinylcarbazole, N-vinylindole, N-vinylpyrrolidene and N-vinylpyrrolidone. These vinyl monomers exist in said high-molecular compounds in a structural form involving unsaturated double bond cleavage.

Among said monomers, methacrylic acids, acrylic acids, aliphatic monocarboxylic acid esters and nitriles are preferred for use in this invention in combination with said structural units (I) as these monomers show generally excellent performance. Methacrylic acid, methyl methacrylate, acrylonitrile and ethyl acrylate prove most effective.

These monomers may be bonded blockwise or randomly in the high-molecular compounds.

Typical examples of the high-molecular weight compounds (B) according to this invention are shown below by way of the structural formulae. In the explanatory notes thereto, Mw denotes weight-average molecular weight, Mn number-average molecular weight, and a, b, c, d and e mol % of the respective structural units.

(a) 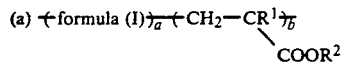

($R^1$ and $R^2$=hydrogen atom, alkyl group or halogen atom; a=10-60 mol %, b=40-90 mol %)

(b) 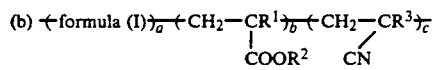

($R^1$-$R^3$)=hydrogen atom, alkyl group or halogen atom; a=10-60 mol %, b=10-60 mol %, c=10-60 mol %)

(c) 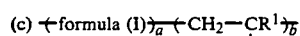

(X=alkyl group or halogen atom; $R^1$=hydrogen atom, alkyl group or halogen atom; a=10-60 mol %, b=40-90 mol %)

(d) 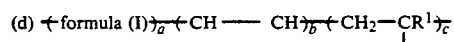
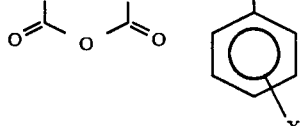

(X=alkyl group or halogen atom; $R^1$=hydrogen atom, alkyl group or halogen atom; a=10-60 mol %, b=10-60 mol %, c=10-60 mol %)

(e) 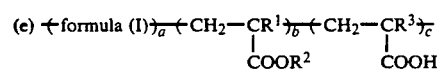

($R^1$-$R^3$=hydrogen atom, alkyl group or halogen atom; a=10-60 mol %, b=10-60 mol %, c=20 mol % or less)

(f) 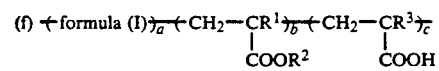

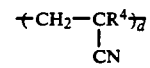

($R^1$-$R^4$=hydrogen atom, alkyl group or halogen atom; a=10-60 mol %, b=10-60 mol %, c=0-20 mol %, d=10-60 mol %)

(g) 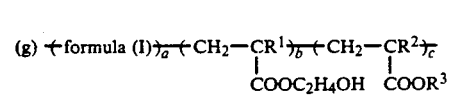

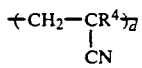

($R^1$-$R^4$=hydrogen atom, alkyl group or halogen atom; a=10-60 mol %, b=10-60 mol %, c=10-60 mol %, d=10-60 mol %)

(h) 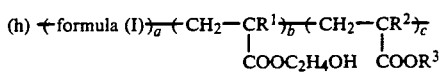

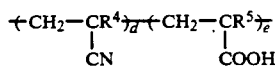

($R^1$-$R^5$=hydrogen atom, alkyl group or halogen atom; a=10-60 mol %, b=10-60 mol %, c=10-60 mol %, d=10-60 mol %, e=20 mol % or less).

Among the compounds of the formulae (a)-(h) shown above, those of the formulae (a), (b), (e), (f) and (g) are especially preferred.

Shown below are the more specific examples of said compounds.

(a-1)
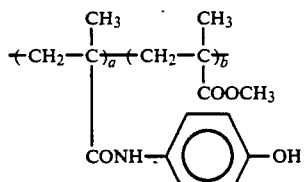

(Mw = 28000, Mw/Mn = 7.8, a:b = 40:60)

(a-2)
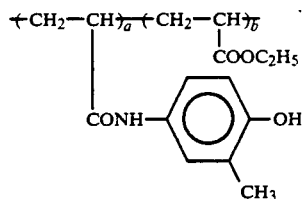

(Mw = 40000, Mw/Mn = 2.5, a:b = 50:50)

(b-1)
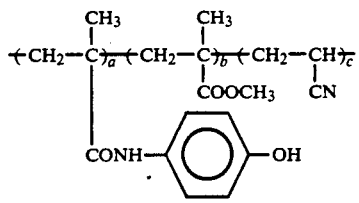

(Mw = 18000, Mw/Mn = 2.1, a:b:c = 30:40:30)

(b-2)
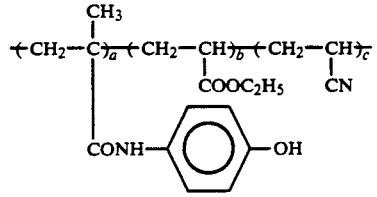

(Mw = 60000, Mw/Mn = 7.5, a:b:c = 40:20:40)

-continued
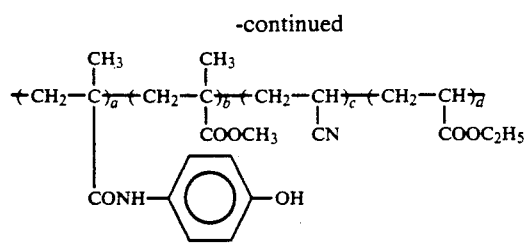
(b-3)
(Mw = 20000, Mw/Mn = 2.2, a:b:c:d = 30:36:30:4)
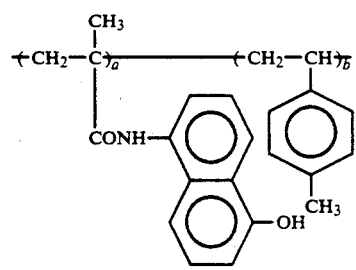
(c-1)
(Mw = 21000, Mw/Mn = 5.3, a:b = 50:50)
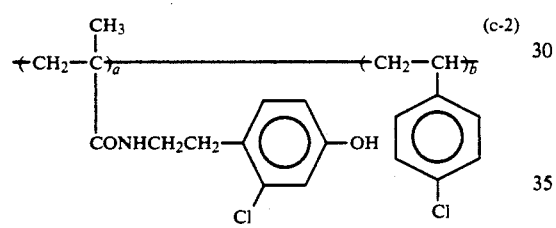
(c-2)
(Mw = 42000, Mw/Mn = 4.8, a:b = 30:70)
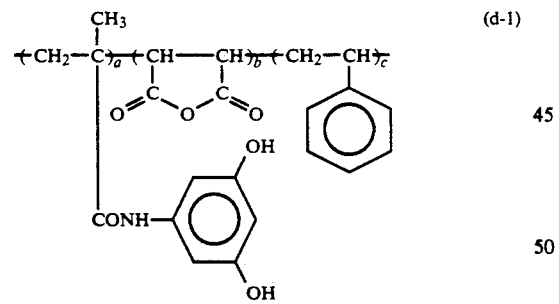
(d-1)
(Mw = 33000, Mw/Mn = 3.5, a:b:c = 30:35:35)
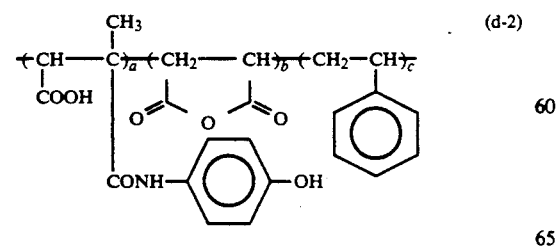
(d-2)
(Mw = 57000, Mw/Mn = 2.9, a:b:c = 25:25:50)
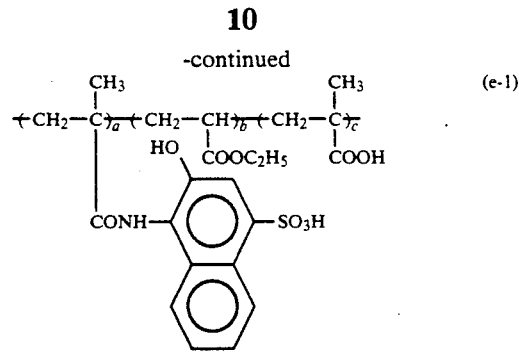
(e-1)
(Mw = 21000, Mw/Mn = 7.2, a:b:c = 50:45:5)
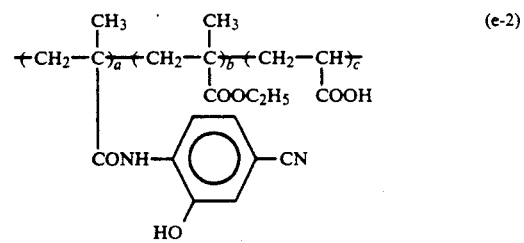
(e-2)
(Mw = 33000, Mw/Mn = 7.0, a:b:c = 38:60:2)
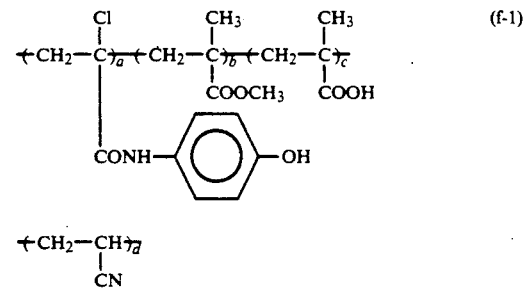
(f-1)
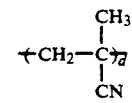
(Mw = 34000, Mw/Mn = 4.8, a:b:c:d = 20:30:5:45)
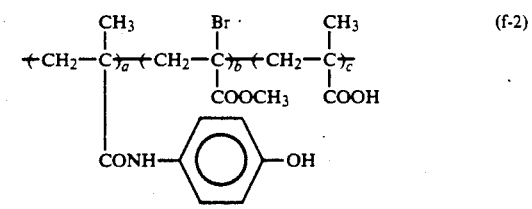
(f-2)
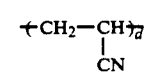
(Mw = 32000, Mw/Mn = 4.4, a:b:c:d = 20:35:5:40)
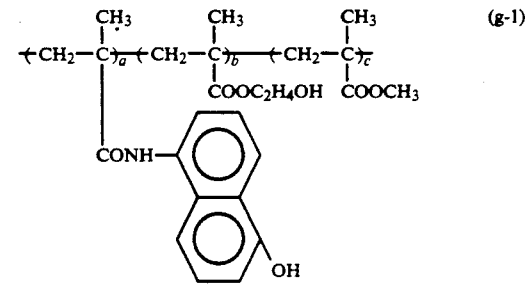
(g-1)

-continued (Mw = 48000, Mw/Mn = 5.3, a:b:c:d = 30:10:30:30)

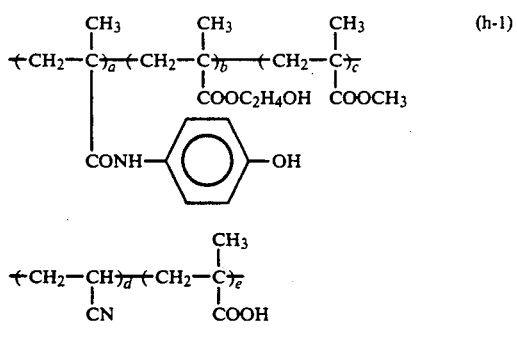

(h-1)

(Mw = 35000, Mw/Mn = 7.9, a:b:c:d:e = 20:15:30:33:2)

The high-molecular weight compounds (B) of this invention can be synthesized by the conventional methods, e.g., in the following way. An $\alpha,\beta$-unsaturated acid chloride or $\alpha,\beta$-unsaturated acid anhydride and a primary or secondary amine having phenolic hydroxyl group(s) are reacted by using, if necessary, a basic catalyst to synthesize a monomer having the structural unit represented by the general formula (I), and the monomer is then monopolymerized by a known method or said monomer and at least one of the other types of vinyl monomers are copolymerized. The high-molecular weight compounds (B) obtained may range widely in molecular weight and molar ratio of the respective structural units by changing the molar ratios of the monomers used and the polymerization conditions. However, for the effective use of these compounds for the intended purpose of this invention, it is desirable that the compounds have a weight-average molecular weight in the range of 5,000 to 100,000, more preferably 5,000 to 50,000. The content of the structural unit of the general formula (I) in said compounds is preferably not less than 10% by mole, more preferably 10 to 50% by mole.

Determination of molecular weight of the high-molecular weight compounds of this invention has been made according to the gel permeation chromatography (GPC) method.

The amount of the compound (B) in the composition of the photosensitive layer of this invention is preferably in the range of 50 to 95% by weight, more preferably 60 to 90% by weight.

The composition of the photosensitive layer of this invention may contain known alkali-soluble high-molecular weight compound(s), for example, novolak resin such as phenol-formaldehyde or cresol-formaldehyde resin, phenolic modified xylene resin, and polyhydroxystyrene resin. The amount of such alkali-soluble high-molecular weight compound added should preferably not exceed 60% by weight of the total composition. If such alkali-soluble high-molecular weight compound is contained in a greater amount, the image area will become vulnerable to the action of UV ink or plate cleaner in the photosensitive layer, making the use of UV ink difficult.

Novolak resins are most preferred for use as alkali-soluble high-molecular weight compound in the composition of this invention.

The novolak resins recommended for use in this invention are those resins obtainable by condensing phenol(s) and formaldehyde in the presence of an acid catalyst. Illustrative examples of the phenols usable for said purpose are phenol, o-cresol, m-cresol, p-cresol, 3,5-xylenol, 2,4-xylenol, 2,5-xylenol, carvacrol, thymol, catechol, resorcin, hydroquinone, pyrogallol and phloroglucinol. These phenolic compounds may be used either singly or in combination for condensation with formaldehyde to obtain the desired resin. The preferred novolak resins for use in this invention are the ones obtainable by co-condensation polymerization of at least one member selected from phenol, m-cresol (or o-cresol) and p-cresol with formaldehyde. Among such novolak resins there may be mentioned phenol-formaldehyde resin, m-cresol-formaldehyde resin, o-cresol-formaldehyde resin, phenol-p-cresol-formaldehyde copolymer resin, m-cresol-p-cresol-formaldehyde co-condensation polymer resin, o-cresol-p-cresol-formaldehyde co-condensation polymer resin, phenol-m-cresol-p-cresol-formaldehyde co-condensation polymer resin, and phenol-o-cresol-p-cresol-formaldehyde co-condensation polymer resin. Among these novolak resins, phenol-m-cresol-p-cresol-formaldehyde resin is most preferred.

In the present invention, said novolak resins may be used either singly or in combination.

The molecular weight (on polystyrene standard) of said novolak resins is preferably in the range of $1.0 \times 10^3$ to $3.0 \times 10^4$, more preferably $3.0 \times 10^3$ to $2.0 \times 10^4$ in terms of weight-average molecular weight and in the range of $3.0 \times 10^2$ to $7.5 \times 10^3$, more preferably $5.0 \times 10^2$ to $4.0 \times 10^3$ in terms of number-average molecular weight.

When novolak resin is added, the amount thereof in the photosensitive layer is preferably in the range of 0.01 to 50% by weight, more preferably 1 to 14% by weight.

An organic acid having a pKa value of 2 or greater is preferably contained in the photosensitive layer. Use of such organic acid can increase the sensitivity of the photosensitive layer and also proves helpful for raising the developing performance of the developer which has been reduced in sensitivity or developing capacity (such developing performance being hereinafter referred to as "underdevelopability"). It also improves the recovery from scumming on the non-image area (hereinafter referred to as "scumming-recovery on the press").

The organic acid used in this invention should have a pKa value of at least 2, preferably 3.0 to 9.0, more preferably 3.5 to 8.0. When the pKa value of the organic acid used is too small, its effect for improving underdevelopability and scumming-recovery on the press proves unsatisfactory. Also, the improvement of sensitivity is scanty. The pKa values mentioned here are the ones measured at 25° C.

Typical examples of such organic acids are the monocarboxylic acids and dicarboxylic acids as shown in the Handbook of Chemistry, Fundamentals II (pp. 1054-1058, 1966, Maruzen), which are capable of having a pKa value in the range specified above. Such monocarboxylic acids and dicarboxylic acids include adipic acid, azelaic acid, isophthalic acid, $\beta$-ethyl-glutaric acid, benzoic acid, m-hydroxybenzoic acid, p-hydroxybenzoic acid, glyceric acid, glutaconic acid, glutaric acid, succinic acid, $\beta,\beta$-diethylglutaric acid, 1,1-cyclobutanedicarboxylic acid, 1,3-cyclobutanedicarboxylic acid, 1,1-cyclopentanedicarboxylic acid, 1,2-cyclopentanedicarboxylic acid, 1,3-cyclopentanedicarboxylic acid, $\beta,\beta$-dimethylglutaric acid, dimethylmalonic acid, $\alpha$-tartaric acid, suberic acid, terephthalic acid, pimelic acid, phthalic acid, fumaric acid, β-propylglutaric acid, propylmalonic acid, mandelic acid, mesotartaric acid, β-methylglutaric acid, β,β-methylpropylglutaric acid, methylmalonic acid, malic acid, 1,1-cyclohexanedicarboxylic acid, 1,2-cyclohexanedicarboxylic acid, 1,3-cyclohexanedicarboxylic acid, 1,4-cyclohexanedicarboxylic acid and 1,2-cyclohexenedicarboxylic acid. Other organic acids having the enol structure such as merdrum acid and ascorbic acid can be also favorably used.

The amount of said organic acid in the photosensitive layer is preferably in the range of 0.05 to 10% by weight, more preferably 0.1 to 10% by weight of the total composition.

It is also advantageous to add a compound having at least one of the following structural units to the photosensitive layer:

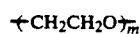  (II)

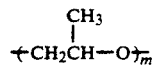  (III)

Addition of such compound(s) improves tolerance against white fluorescent light exposure (hereinafter referred to as "safe-light tolerance") as well as ink adhesion to the plate surface at the start of printing (hereinafter referred to as "ink adhesiveness").

Any of the compounds having at least one of the above structural units (II) and (III) is usable in this invention, but it is recommended to use those compounds in which m in the above structural units (II) and (III) is an integer falling in the range from 2 to 5,000, more preferably from 2 to 500, most preferably from 3 to 100. When m is outside the above-defined range, the composition constituting the photosensitive layer tends to be lowered in developability.

Examples of such compounds are polyethylene glycol HO—(CH$_2$CH$_2$O)$_m$H; polyoxyethylene alkyl ether RO(CH$_2$CH$_2$O)$_m$H; polyoxyethylene alkylphenyl ether

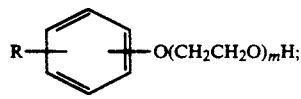

polyoxyethylene polystyrylphenyl ether

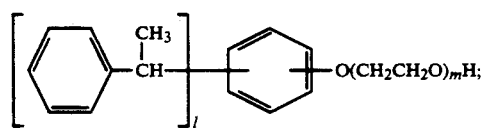

polyoxyethylene-polyoxypropylene glycol

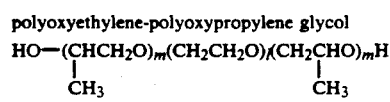

(including both block polymers and random polymers); polyoxyethylene-polyoxypropylene alkyl ether (forming alkyl ether at the end of the molecule; including random polymers);

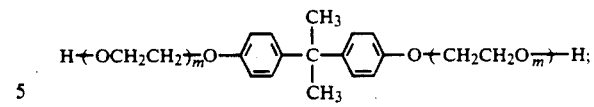

ethylene oxide derivatives of alkylphenol-formaldehyde condensate

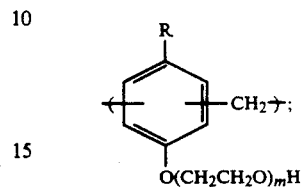

polyoxyethylene-polyhydric alcohol fatty acid partial esters such as

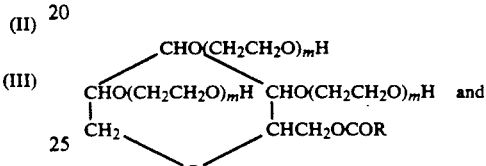

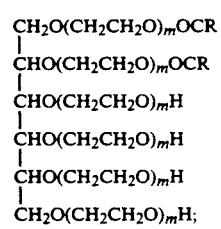

polyoxyethylene fatty acid esters such as RCOO(CH$_2$CH$_2$O)$_m$H;

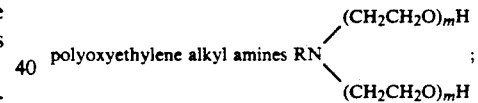

polyoxyethylene castor oil; and polyoxyethylene sorbitol fatty acid esters

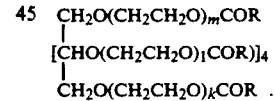

More concretely, the following may be mentioned as preferred examples of said compounds: polyoxyethylene lauryl ether, polyoxyethylene cetyl ether, polyoxyethylene stearyl ether, polyoxyethylene oleyl ether, polyoxyethylene higher alcohol ether, polyoxyethylene octylphenyl ether, polyoxyethylene nonylphenyl ether, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbitol tetraoleate, polyethylene glycol monolaurate, polyethylene glycol monostearate, polyethylene glycol monooleate, polyethylene glycol distearate, polyoxyethylene nonylphenyl ether-formaldehyde condensate, oxyethylene-oxypropylene block copolymer, polyethylene glycol, tetraethylene glycol, polyoxyethylene stearyl ether, polyoxyethylene sorbitol lauryl ester, and polyoxyethylene castor oil.

The amount of such compound(s) in the photosensitive layer is preferably in the range of 0.1 to 20% by weight, more preferably 0.2 to 10% by weight based on the total composition.

Also, these compounds may be used either singly or in combination provided that the content thereof in the composition is within said range.

Generally, the positive type photosensitive planographic printing plates also contain an image-additive after exposure and a pigment. Usually a material which generates an acid upon exposure is used as image-additive after exposure, and a compound which forms a salt with said acid is used as pigment.

As the material which generates an acid upon exposure, the trihaloalkyl compounds or diazonium salt compounds represented by the following general formula (IV) or (V) are preferably used:

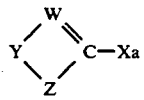  (IV)

wherein Xa is a trihaloalkyl group having 1 to 3 carbon atoms, W is N or P, Z is O, S or Se, and Y is a group capable of cyclizing W and Z and having a chromophoric group, and $$Ar-N_2^+X^- \quad (V)$$

wherein Ar is an aryl group, and X is an inorganic counter ion.

As more concrete examples of the trihaloalkyl compounds of the formula (IV), the compounds represented by the following general formulae (IVa), (IVb) and (IVc) may be mentioned:

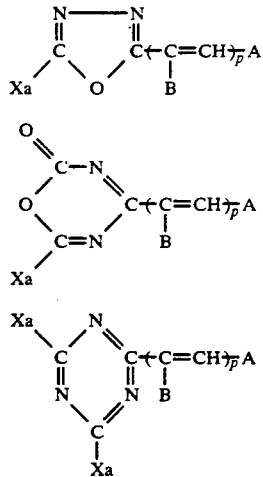

wherein A is a substituted or non-substituted aryl group or a heterocyclic group, B is a hydrogen or a methyl group, and p is an integer of 0 to 2.

The amount of the image-additive after exposure added is preferably 0.01 to 20% by weight, preferably 0.1 to 10% by weight based on the total composition of the photosensitive layer.

As for the pigment, any of the compounds capable of forming a salt with said acid is usable, the typical examples thereof being triphenylmethane dyes, cyanine dyes, diazo dyes and styryl dyes.

More concretely, such dyes include Victoria pure blue BOH, ethyl violet, crystal violet, brilliant green, basic fuchsine, eosine, phenolphthalein, xylenol blue, Congo red, malachite green, oil blue #603, oil pink #312, cresol red, auramine, 4-p-diethylaminophenyliminonaphthoquinone, leucomalachite green, and leuco-crystal violet. The amount of pigment used in this invention is preferably in the range of 0.01 to 10% by weight, more preferably 0.05 to 8% by weight based on the total composition of the photosensitive layer.

The photosensitive layer composition of the positive photosensitive planographic printing plate according to this invention may contain various other additives, depending upon the intended purposes. For instance, a surface active agent may be added for improving spreadability, various types of sensitizers for improving sensitivity and a plasticizer for improving the coating film properties. Also, for bettering printing ink adhesiveness to the image area, there can be added various types of additives having a hydrophobic group, such as p-octylphenol-formalin novolak resin, p-t-butylphenol-formalin novolak resin, p-t-butylphenol-benzaldehyde resin, modified novolak resins such as rosin-modified novolak resin, and o-naphthoquinonediazidosulfonic esters of such modified novolak resins (esterification rate of hydroxyl group being 20 to 70%). The content of these additives in the composition of this invention vary depending on the type of the additives(s) used and the purposes, but generally these additives are contained in an amount of 0.01 to 20% by weight, preferably 0.05 to 10% by weight based on the total composition of the photosensitive layer.

Said photosensitive layer composition is dissolved in a suitable solvent, for example, cellosolves such as methyl (ethyl) cellosolve, and methyl (ethyl) cellosolve acetate, or other coating solvents such as dimethylformamide, dimethyl sulfoxide, dioxane, acetone, cyclohexane, and trichloroethylene, then coated on a support and dried to form a photosensitive layer.

The photosensitive layer of the positive photosensitive planographic printing plate according to this invention is preferably so formed that its weight per unit area calculated in terms of solids will be 0.5 to 3.0 g/m² although subject to change according to the purpose of use of the printing plate. Coating of the photosensitive layer on the support surface can be accomplished by various known methods such as rotational coating, wire bar coating, dip coating, air knife coating, roll coating, blade coating and curtain coating.

As the support used for the positive photosensitive planographic printing plate of this invention, the following may be mentioned: metal plates such as aluminum, zinc, steel and copper plates; metal plates plated or vapor-deposited with chromium, zinc, copper, nickel, aluminum, iron or the like; paper; plastic films and glass plates; resin-coated paper; paper foiled with a metal such as aluminum; and plastic films subjected to a hydrophilic treatment. Among them, aluminum plate is preferred. Aluminum plate is preferably subjected to sand graining, anodizing and, if necessary, a surface treatment such as sealing. These treatments can be performed by known methods.

Sand graining can be accomplished either by mechanical methods or by electrolytic etching. The mechanical methods include ball polishing, brushing, liquid honing and buffing. Said methods may be used either singly or in combination according to the aluminum plate composition and other factors. Usually electrolytic etching is preferred.

Electrolytic etching is carried out by immersing an aluminum plate in a bath containing one or more inorganic acids such as phosphoric acid, sulfuric acid, hydrochloric acid, and nitric acid. After sand graining, the plate is subjected if necessary to a desmutting treatment with an alkali or an acid, neutralized and then washed with water.

Anodizing treatment is performed by carrying out electrolysis on the aluminum plate serving as anode in an electrolytic solution containing at least one of sulfuric acid, chromic acid, oxalic acid, phosphoric acid, malonic acid and other like acids. The amount of the oxide film thus formed is preferably 1 to 50 mg/dm$^2$, more preferably 10 to 40 mg/dm$^2$. The amount of the formed oxide film can be determined, for example, by immersing the anodized aluminum plate in a phosphoric acid-chromic acid solution (formed by dissolving 35 ml of aqueous 85% phosphoric acid solution and 20 g of chromium oxide (VI) in 1 litre of water) to dissolve the oxide film and measuring the weight change of the plate before and after dissolution of the oxide film.

Sealing of the aluminum plate surface can be accomplished, for example, by boiling water treatment, water vapor treatment, sodium silicate treatment or bichromate solution treatment. The aluminum support may be also subjected to a substratum treatment with an aqueous solution of a water-soluble high-molecular weight compound or a metal salt such as fluorozirconate.

The positive photosensitive planographic printing plate obtained in the manner described above can be put to practical use in known ways. Typically, a positive film is tightly adhered to the photosensitive printing plate, exposed to an ultra-high pressure mercury lamp, metal halide lamp or the like as light source and developed with an alkaline aqueous solution such as an aqueous solution of sodium metasilicate, potassium metasilicate, sodium phosphate, sodium hydroxide or the like to obtain the desired printing plate.

The thus obtained planographic printing plate of this invention is usable in sheet-fed presses and roll-fed offset printing presses.

EXAMPLES

The present invention will be described in further detail below with reference to the examples thereof. In the descriptions which follow, all the "parts" are by weight unless otherwise noted.

First, synthesis of the high-molecular weight compounds and photosensitive materials (o-quinonediazidosulfonic esters) used in this invention is described.

Synthesis of high-molecular weight compounds

SYNTHESIS EXAMPLE 1

Synthesis of high-molecular compound (b-1)

A mixture of 400 g of p-hydroxyaniline, 4 g of hydroquinone monomethyl ether, 4 litres of acetone and 360 g of pyridine was cooled externally with a freezing medium, and at a point when the internal temperature of the mixture had lowered to −10° C., 420 g of methacrylic acid chloride was added dropwise to the mixture with stirring. The dropping rate was adjusted so that the reaction temperature was kept below 0° C. After completion of said dropwise addition, the solution was stirred at 0°–3° C. for about 2 hours, followed by further stirring at 25° C. for 2 hours. The reaction solution was concentrated to one-third of its original volume and poured into 10 litres of dilute hydrochloric acid (with pH of about 1.0). The produced precipitate was filtered with suction to obtain white solids. These white solids were dissolved in 2 litres of heated methanol. To this solution was added 2 litres of 5% sodium carbonate solution, followed by stirring at 40° C. for 30 minutes. This dark red solution was poured into 8 litres of 5% hydrochloric acid to form a large amount of precipitate. This precipitate was subjected to suction filtration and dried to obtain light-pink solids. The solids were recrystallized from ethanol/water mixed solvent to obtain 450 g of colorless needle crystals of p-hydroxy-methacrylanilide having a melting point of 155°–156° C.

53.2 g of thus obtained p-hydroxymethacrylanilide (HyPMA), 15.9 g of acrylonitrile (AN), 40.0 g of methyl methacrylate (MMA) and 3 g of $\alpha,\alpha'$-azobisisobutyronitrile were dissolved in 250 ml of ethanol. After atmospheric replacement with nitrogen gas, the solution was heated at 75° C. for 4 hours to obtain a polymer solution. This polymer solution was poured into 3 litres of aqueous 5% HCl solution, and the produced white precipitate was filtered and dried to obtain 70 g of a white polymer. The molecular weight of the polymer was measured by the GPC method (Hitachi 635-Type, Column comprising Shodex A-804, A-803 and A-802 in series) using polystyrene as standard. Mn and Mw were calculated by the method described in the Apr. 1972 issue of Bulletin of Japan Chemical Society, p. 800 (Tsuge, et al), in which the mean values are determined by levelling the peaks in the oligomer region (connecting the centers of the peak top and the bottom). Mn of the polymer was 8,600 and Mw was 18,000.

SYNTHESIS EXAMPLE 2

Synthesis of high-molecular weight compound (b-3)

53.1 g of the p-hydroxymethacrylanilide (HyPMA) obtained in Synthesis Example 1, 15.9 g of acrylonitrile (AN), 4 g of ethyl acrylate (EA), 36 g of methyl methacrylate (MMA) and 3 g of $\alpha,\alpha'$-azobisisobutyronitrile were dissolved in 150 ml of ethanol. After atmospheric replacement with nitrogen gas, the solution was heated at 75° C. for 4 hours to obtain a polymer solution. This polymer solution was poured into 3 litres of aqueous 5% HCl solution. The resultant formed white precipitate was filtered and dried to obtain 65 g of a white polymer. The molecular weight of the polymer determined by the GPC method was 9,090 in Mn and 20,000 in Mw.

SYNTHESIS EXAMPLE 3

Synthesis of high-molecular weight compound (e-2)

400 g of o-hydroxy-p-cyanoaniline, 4 g of hydroquinone monomethyl ether, 4 litres of acetone, and 360 g of pyridine were mixed and the mixture was cooled externally with a freezing medium. At a point when the internal temperature of the solution had dropped to −10° C., 420 g of methacrylic acid chloride was added dropwise to the mixture with stirring. Thereafter the mixture was treated in the same way as in Synthesis Example 1 to obtain 350 g of o-hydroxy-p-cyanomethacrylanilide. 76.8 g (0.38 mol) of this o-hydroxy-p-cyanomethacrylanilide was dissolved together with 68.4 g (0.60 mol) of ethyl methacrylate, 1.44 g (0.02 mol) of acrylic acid and 0.7 g of $\alpha,\alpha'$-azobisisobutyronitrile in 300 ml of an acetone/ethanol (1/2) mixed solvent. After replacing the atmosphere with nitrogen gas, the solution was heated at 65° C. for 4 hours to obtain a polymer solution. This polymer solution was poured into 3 litres of aqueous 5% HCl solution and the produced white precipitate was filtered and dried, giving 75 g of a white polymer. Determination of molecular weight of this polymer by the GPC method showed Mn=4,700 and Mw=33,000.

SYNTHESIS EXAMPLE 4

Synthesis of high-molecular weight compound (g-1)

227 g of 5-amino-α-naphthol, 1 g of hydroquinone monomethyl ether and 2 litres of pyridine were mixed and cooled to −10° C. by using a freezing medium, and then 110 g of methacrylic acid chloride was added dropwise to the mixture with stirring. After said dropwise addition ended, the solution was stirred at 0°–3° C. for 2 hours, followed by additional 2-hour stirring at 25° C. The reaction solution was poured into 20 litres of ice water. The resultantly formed precipitate was filtered, washed with water and dried. The resulting solids were added into 2 litres of a methanol aqueous 5% sodium carbonate (1/1) mixed solvent, and stirred at 40° C. for 30 minutes and the solution was poured into 4 litres of 5% hydrochloric acid. A large amount of precipitate was formed. This precipitate was suction filtered and recrystallized from ethanol to give 210 g of N-(5-hydroxy-α-naphthyl)methacrylamide having a melting point of 223°–224° C.

68 g (0.3 mol) of the thus obtained N-(5-hydroxy-α-naphthyl)methacrylamide was dissolved together with 10 g (0.1 mol) of 2-hydroxyethyl methacrylate, 30 g (0.3 mol) of methyl methacrylate, 15.9 g (0.3 mol) of acrylonitrile and 0.50 g of α,α′-azobisisobutyronitrile in 200 ml of an acetone/ethanol (1/2) mixed solvent. The resulting solution was heated at 65° C. for 8 hours in a closed tube having its inside atmosphere replaced with nitrogen gas. The treatment gave a copolymer solution. This copolymer solution was diluted with 100 ml of methanol and poured into water. The produced precipitate was filtered and dried to obtain 70 g of a white polymer. Determination of its molecular weight by the GPC method showed Mn=9,100 and Mw=48,000.

COMPARATIVE SYNTHESIS EXAMPLE 1

The process of Synthesis Example 1 was followed but by using 2-hydroxyethyl methacrylate in place of p-hydroxymethacrylanilide. The molecular weight of the obtained polymer was determined by the GPC method, showing Mn=2,300 and Mw=15,000.

COMPARATIVE SYNTHESIS EXAMPLE 2

90 g of m-cresol, 56 g of p-cresol, 54 g of phenol, 105 g of aqueous 37% formaldehyde solution and 2.5 g of oxalic acid were supplied into a three-necked flask set in an oil bath, and the mixture was heated with stirring. As violent foaming took place at around 90° C., the mixture was temporarily cooled and then again heated till the internal temperature reached 150° C. After approximately 3-hour reaction, the mixture was again heated to 175° C. and water was distilled off. 2 Hours later, the mixture was further heated to 200° C. while reducing the pressure to 100 mmHg and the residual monomers were distilled off. The reaction was stopped 10 minutes later, and the reaction product was flown out into a Teflon butt and solidified. The molecular weight of the obtained resin was determined by the GPC method with polystyrene as standard. Mn and Mw were calculated in the same way as described above. The results showed Mn of the product was 1,350 and Mw 6,750.

Synthesis of photosensitive material

COMPARATIVE SYNTHESIS EXAMPLE 1a 100 g of pyrogallol and 700 g of acetone were supplied into a three-necked flask set in a water bath. After replacing the flask atmosphere with nitrogen gas, 10 g of phosphorus oxychloride was supplied into the flask to initiate a polycondensation reaction. The reaction was continued for a whole day and night while keeping the reaction temperature at 20° C. Thereafter the reaction product was supplied piecemeal into 30 litres of water with vigorous stirring, causing precipitation of the polycondensate.

The precipitated resin was filtered, washed with water till it became substantially neutral, and then dried at a temperature below 40° C. 100 g of a light-brown resin was obtained.

Determination of molecular weight of this resin by the GPC method showed Mn=2,000 and Mw=3,400.

60 g of this resin was dissolved in 720 ml of dioxane. Then 70 g of 1,2-naphthoquinonediazido-5-sulfonyl chloride was dissolved in the solution, followed by dropwise addition of 60 g of aqueous 13 wt % potassium carbonate to carry out a condensation reaction at 40°–50° C. for about one hour. The resulting reaction solution was supplied into a large amount of a dilute hydrochloric acid (comprising 13 ml of concentrated hydrochloric acid and 3 litres of water). The precipitated resin was filtered and dried. There was thus obtained 56 g of the 1,2-naphthoquinonediazido-5-sulfonic ester of pyrogallol-acetone resin as yellow powder. The result of analysis showed the condensation rate of the hydroxyl group was 20%. The molecular weight of this ester product was determined by the GPC method described above, showing Mn=2,300 and Mw=3,030.

EXAMPLE 1

A 0.24 mm thick aluminum plate was degreased by immersing in aqueous 5% sodium hydroxide solution and then subjected to electrolytic etching in aqueous 0.3 mol nitric acid solution at a temperature of 30° C. and a current density of 50 A/dm² for 30 seconds. It was further subjected to a desmutting treatment in aqueous 5% sodium hydroxide solution, followed by anodizing in an aqueous sulfuric acid solution. The amount of the oxide film formed by anodization, measured by the same method as described above, was 20 mg/dm². The thus treated aluminum plate was then immersed in a hot aqueous solution at 90° C. for sealing of the plate surface.

The thus prepared aluminum support was created with a photosensitive coating solution (sensitizing solution 1) of the following composition by using a rotary coater and dried at 100° C. for 4 minutes to obtain a photosensitive planographic printing plate having a photosensitive coating film thickness of 24 mg/dm².

| Sensitizing solution 1 | |
|---|---|
| Esterification product of 2,3,4-trihydroxybenzophenone and 1,2-naphthoquinonediazido-5-sulfonic acid chloride (substantial condensation rate: 95%) | 20 parts |
| High-molecular weight of Synthesis Example 1 | 80 parts |
| 2-trichloromethyl-5-(β-(2′-benzofuryl)vinyl)-1,3,4-oxadiazole | 2 parts |

-continued

Sensitizing solution 1

The photosensitive planographic printing plate was exposed for 30 seconds with a 3 KW ultra-high pressure mercury lamp positioned at a distance of 60 cm from said plate and then developed at 25° C. for 45 seconds by using a 9 times diluted solution of a positive developer for PS plates "SDP-1" (available from Konishiroku Photographic Industries Co., Ltd.).

The sensitivity and chemical resistance of the obtained planographic printing plate were determined.

EXAMPLE 2

A photosensitive coating solution (sensitizing solution 2) was prepared in the same way as Example 1 except that the high-molecular weight compound of Synthesis Example 2 was used in place of the high-molecular weight compound of Synthesis Example 1. A photosensitive planographic printing plate was made by using said coating solution as in Example 1, and the same determinations were made on this printing plate as in Example 1.

COMPARATIVE EXAMPLE 1

A photosensitive planographic printing plate was made according to the method of Example 1 by using a photosensitive coating solution (comparative sensitizing solution 1) prepared in the same way as Example 1 except that the high-molecular weight compound of Comparative Synthesis Example 2 was used in place of the high-molecular weight compound of Synthesis Example 1, and this printing plate was subjected to the same determinations as made in Example 1.

The results of determinations on the printing plates of Example 1, Example 2 and Comparative Example 1 are shown in Table 1.

TABLE 1

| | Example 1 | Example 2 | Comp. Example 1 |
|---|---|---|---|
| Composition of sensitizing solution | Sensitizing solution 1 | Sensitizing solution 2 | Comparative sensitizing solution 1 |
| High-molecular weight compound | Synthesis Ex. 1 (b-1) | Synthesis Ex. 2 (b-3) | Comp. Synthesis Ex. 2 |
| Composition (mol %) | HyPMA:AN:MMA = 30:30:40 | HyPMA:AN:MMA:EA = 30:30:36:4 | m-cresol/p-cresol/phenol[1] = 45:28:27 |
| Mw | 18,000 | 20,000 | 6,750 |
| Clear sensitivity | 3.1 steps | 3.3 steps | 3.1 steps |
| Chemical resistance[2] | | | |
| 50% isopropyl alcohol | 10 | 10 | 3 |
| Ultra Plate Cleaner[3] | 10 | 10 | 4 |
| Polymetic Plate Cleaner[4] | 10 | 10 | 3 |
| FD Plate Cleaner[5] | 10 | 10 | 1 |
| UV Roller Cleaner[6] | 10 | 8 | 1 |
| Developing ink SPO-1[7] | 10 | 10 | 3 |

Notes:
[1] Novolak resin.
[2] Chemical resistance was determined by immersing each printing plate in the respective chemicals and visually observing the degree of damage to the image area. Evaluation was made on a 10-point system. (10: excellent; 5: substantial damage to the image area (small dots have vanished); 0: image area has vanished).
[3] Made by ABC Chemicals.
[4] Made by Eastman Kodak.
[5] For UV ink, made by Toyo Ink.
[6] For UV ink, made by Toka Shikiso.
[7] Made by Konishiroku.

| | |
|---|---|
| Victoria Blue BOH (C.I. 42595) (HODOGAYA CHEMICAL CO., LTD.) | 1 part |
| Esterification product of p-t-octylphenol-formaldehyde novolak resin (Mw = 1,300) and 1,2-naphthoquinone-diazido-5-sulfonic acid chloride (condensation rate: 50%) | 1 part |
| Glutaric anhydride | 3 parts |
| Methyl cellosolve | 200 parts |
| Ethyl cellosolve | 500 parts |

The results of Table 1 attest the excellent chemical resistance (including UV ink performance) of the printing plates according to the present invention.

EXAMPLE 3

Printability, developing quality and printing durability of the planographic printing plate of Example 1 were tested.

Printability was evaluated by examining the prints as to scumming after carrying out printing with a sheet-fed offset press equipped with said planographic printing plate and using high-quality printing paper.

As a result of printing by using said printing plate, it was possible to obtain good prints perfectly free of scumming, indicating excellent printability of this printing plate.

For the evaluation of developing quality, the photosensitive planographic printing plate was kept under the condition of 40° C. and 80% RH for 7 days to expose it to forced deterioration, and then the plate was exposed, developed with 4 m²/l of SDP-1 fatigued developer (diluted 7 times) and subjected to printing. As a result, no scumming took place and good prints were obtained. This indicates excellent developing quality of the printing plate.

For evaluating printing durability, printing was carried out with UV ink under the following conditions:
Press: Hamada-Star CDX-900
Ink: Toyo Finish-Dry-OL-Red Ap (Toyo Ink Co., Ltd.)
Reducer: Toyo Finish-Dry Reducer OP (Toyo Ink Co., Ltd.)
Plate cleaner: Toyo Finish-Dry Plate Cleaner (Toyo Ink Co., Ltd.)
Paper: High-quality paper
Printing speed: 7,000 copies/hr 30,000 copies were printed off by using the printing plate of Example 1 of this invention. All of the copies were excellent and free of scumming.

On the other hand, when UV printing was carried out under the same conditions but by using the planographic printing plate of Comparative Example 1, the image on the printing plate vanished soon after printing was started.

COMPARATIVE EXAMPLE 2

A photosensitive planographic printing plate was made by using a photosensitive coating solution (comparative sensitizing solution 2) of the same composition as that of Example 1 save for the change of the high-molecular weight compound of Example 1 from that of Synthesis Example 1 to that of Comparative Synthesis Example 1 (p-hydroxymethacrylanilide (HyPMA) units were changed to 2-hydroxyethyl methacrylate). This printing plate was exposed and developed in the same way as Example 1, but it was incapable of development. This dictates the importance of the presence of the phenolic hydroxyl group.

COMPARATIVE EXAMPLE 3

A photosensitive planographic printing plate was made according to the process of Example 1 by using a photosensitive coating solution (comparative sensitizing solution 3) prepared in the same way as Example 1 except for the change of photosensitive material from the esterification product of 2,3,4-trihydroxybenzophenone to the photosensitive material of Comparative Synthesis Example 1a (quinonediazido esterification product of pyrogallol-acetone resin; Mw=3,030, Mn=2,300, esterification rate=20%).

For determining the latitude in development of this photosensitive planographic printing plate, it was exposed and developed in the same way as Example 1 except that the dilution degree of the developer was changed. Also, in order to see ball pen performance, lines were drawn on said photosensitive planographic printing plate before exposure and development by using the following three types of ball pens: ZEBRA N-5100, black (made by Zebra Co., Ltd., referred to as ball pen (i)), TOMBOW GOLF, blue (made by Tombow Pencil Co., Ltd., referred to as ball pen (ii)), and PILOT BS, blue (made by Pilot Fountain Pen Co., Ltd., referred to as ball pen (iii)). The plate was allowed to stand for 10 minutes and then, without exposure, subjected to the same developing treatment as in Example 1. The ball pen performance was evaluated by the degree of corrosion (ranked in three grades, A, B and C) of the photosensitive layer after drawing.

The results are shown in Table 2.

TABLE 2

| Photosensitive material | Sensitizing solution 1 Esterification product of 2,3,4-trihydroxybenzophenone | Comparative sensitizing solution 3 Esterification product of pyrogallol-acetone resin | Remarks |
| --- | --- | --- | --- |
| Latitude in development | | | |
| Times of dilution | | | |
| 5 | +2 steps | Image has disappeared | Overdevelopability |
| 6 | +0.5 steps | Image has half disappeared | Overdevelopability |
| 9 | ○ | ○ | Standard |
| 12 | ○ | ○ | Underdevelopability |
| 15 | ○ | △ | Underdevelopability |
| Ball pen performance | | | |
| (i) | A | B | |
| (ii) | A | C | |
| (iii) | B | C | |

A: Image area was only slightly corroded.
B: Image area was corroded noticeably and the grain of the support below the photosensitive layer was slightly exposed.
C: Image area was corroded extensively and the grain of the support below the photosensitive layer was perfectly exposed.
Regarding underdevelopability:
○: The photosensitive layer of the non-image area was perfectly dissolved away,
△: The photosensitive layer of the non-image area remained partly, and
x: The photosensitive layer of the non-image area was scarcely dissolved.
Regarding overdevelopability, the numerical values show the difference in number of solid steps from the standard development; − (minus) indicates excessive corrosion of the image area and so bad overdevelopability that the number of solid steps can hardly be determined.

the above results show that the latitude in development and ball pen performance are improved significantly by using the esters of 2,3,4-trihydroxybenzophenone as sensitive material.

EXAMPLE 4

A 0.29 mm thick aluminum plate was degreased in aqueous 5% sodium hydroxide solution and then subjected to electrolytic etching in 0.5 mol hydrochloric acid under the conditions of 25° C., 60 A/dm² (current density) and 30 seconds (treating time). It was then subjected to a desmutting treatment in aqueous 5% sodium hydroxide solution, followed by anodizing in a sulfuric acid solution. The amount of the formed oxide film as determined by the above-described method was 20 mg/dm².

Then the plate was immersed in a hot aqueous solution at 90° C. for sealing of the plate surface.

The thus obtained aluminum support was rotary coated with a photosensitive coating solution (sensitizing solution 3) of the following composition to obtain a photosensitive planographic printing plate having a photosensitive coating film thickness of 24 mg/dm².

| Sensitizing solution 3 | |
| --- | --- |
| Esterification product of 2,3,4,4'-tetrahydroxybenzophenone and naphthoquinone-(1,2)-diazido-5-sulfonic acid chloride (condensation rate: 75%) | 20 parts |
| High-molecular weight compound of Synthesis Example 3 | 70 parts |
| Novolak resin (m-cresol/p-cresol/phenol = 48/32/20 mol %; Mw = 4,000) | 10 parts |
| 2-trichloromethyl-5-(β-(2'-benzofuryl)-vinyl)-1,3,4-oxadiazole | 2 parts |
| Victoria blue BOH | 1.1 parts |
| P-octylphenol-formaldehyde novolak resin (Mw = 1,200, Mn = 500) | 1 part |
| Tetrahydrophthalic anhydride | 1 part |
| Methyl cellosolve | 200 parts |
| Ethyl cellosolve | 500 parts |

For evaluating printing durability of this planographic printing plate, printing was carried out in the same manner of Example 1 by using UV ink.

40,000 copies were printed off without causing any bit of scumming under the same printing conditions as in Example 3.

EXAMPLE 5

A planographic printing plate was made in the same way as Example 4 except that only 5 parts out of 20 parts of sensitive material was replaced with a quinonediazido esterification product of pyrogallol-acetone resin (Mw=1,600, Mn=800, esterification rate=30%).

By using this printing plate, UV printing was carried out under the same conditions as in Example 4 to print off 30,000 copies. All the copies were neatly printed.

EXAMPLE 6

A 0.24 mm thick aluminum plate (material: 1050; refining: H 16) was degreased in aqueous 5 wt % sodium hydroxide solution at 60° C. for one minute and then subjected to electrolytic etching in 1 litre of 0.5 mol hydrochloric acid under the conditions of 25° C., 60 A/dm$^2$ (current density) and 30 seconds (treating time). Then the plate was subjected to a desmutting treatment in aqueous 5 wt % sodium hydroxide solution at 60° C. for 10 seconds, followed by anodizing in aqueous 20 wt % sulfuric acid solution under the conditions of 20° C., 3 A/dm$^2$ and one minute treatment. The plate was further subjected to a sealing treatment in hot water at 30° C. for 20 seconds to make an aluminum support for a planographic printing plate.

The thus obtained aluminum support was rotary coated with a photosensitive coating solution (sensitizing solution 4) of the following composition and dried at 90° C. for 4 minutes to make a positive photosensitive planographic printing plate (Sample No. 1).

| Sensitizing solution 4 | |
|---|---|
| Orthoquinonediazido compound (QD-1) | 13 parts |
| High-molecular weight compound (Compound (i) shown below) | 25 parts |
| Succinic acid | 2.3 parts |
| Victoria Pure Blue BOH (made by Hodogaya Chemical Co., Ltd.) | 0.8 part |
| 2-trichloromethyl-5-(β-(2'-benzofuryl)vinyl)-1,3,4-oxadiazole | 1.3 parts |
| Methyl cellosolve | 97.5 parts |

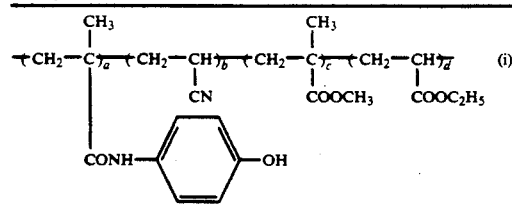

(Mw = 20,000, Mw/Mn = 2.1, a:b:c:d = 30:30:36.5:3.5).

A step tablet for determining sensitivity (Eastman Kodak Step Tablet No. 2, 21-step gray scale with a density difference of 0.15 from one step to another) was attached to the surface of the photosensitive layer of said sample and then the said sample was exposed at a light intensity of 8.0 mW/cm$^2$ by using a 2 KW metal halide lamp as light source. Then this sample printing plate was developed with a developer SDR-1 (available from Konishiroku Photo Industries Co., Ltd.) diluted 6 times with water (hereinafter referred to as standard developer) at 25° C. Sensitivity was indicated by the exposure time required till step four of said step tablet became perfectly clear.

For determining underdevelopability, there was evaluated the developability with the developers with diluted alkali densities, namely the developers with reduced developing performance. Said developability was evaluated by two methods. In one method, development was conducted at 25° C. for 40 seconds with changing the dilution of SDR-1 to 11 times and 13 times and then the non-image area was erased with an eraser SIR-15 (available from Konishiroku Photo Industries Co., Ltd.), followed by inking. In the other method, the halftone dots were developed and these parts were inked likewise.

For determining chemical resistance of said printing plate, its durability against Ultra Plate Cleaner (made by A. B. C. Chemicals Corp.), a cleaner used for removing scums formed on the non-image area during printing, and developing ink SPO-1 (made by Konishiroku Photo Industries Co., Ltd.), an ink used for development inking, was examined. The image-formed printing plate was immersed in each of said treating solutions at room temperature for a predetermined period of time and, after washing with water, the image area of the printing plate was compared with that before said immersion to judge the degree of corrosion of the image area by the treating chemicals.

Next, the printing test was carried out of said printing plate. Printing was carried out with said printing plate by using DIC Dai-Cure Process Red Ink (available from Dai Nippon Ink & Chemical Industries Co., Ltd.) and cleaning the plate surface with Ultra Plate Cleaner (A. B. C. Chemical Corp.) upon printing every 5,000 copies. Evaluation was made by printing a total of 30,000 copies.

Scumming-recovery on the press was also evaluated by the number of copies printed till the ink was removed from the non-image area in a printing operation in which ink was applied onto the entire surface of the printing plate without giving water and then water was given to the plate surface. The smaller the number of copies printed till the ink is removed from the non-image area, the better is the scumming-recovery of the printing plate.

Overdevelopability was evaluated by determining the difference between the number of solid steps (the minimum number of steps where the photosensitive layer remains in the gray scale of the step tablet) when using a developer obtained by adding 0.2 litre or 0.5 litre a 4 times diluted solution of SDR-1 to 9.0 litres of the standard developer and the number of solid steps when using the standard developer. The smaller the difference, the better is overdevelopability.

The results of these evaluations are shown in Table 3, on the first lateral column under Sample No. 1.

Planographic printing plates, Samples Nos. 2-14, were made in the same way as Sample No. 1 except that at least one of the components orthoquinonediazido compound (QD-1), high-molecular weight compound (i) and succinic acid (used as organic acid) of the photosensitive coating solution was changed as shown in Table 3 and that, in some cases, no high-molecular weight compound was added or a novolak resin was added. These printing plates were subjected to the same evaluations as conducted on Sample No. 1, obtaining the results shown in Table 3.

TABLE 3

| Sample No. | *1 o-quinone-diazido compound | High-molecular weight compound | *2 Novolak resin | Organic acid | pKa | *5 Underdevelopability Diluted 11 times | *5 Underdevelopability Diluted 13 times | Sensitivity (sec) | *6 Chemical resistance UPC *7 | *6 Chemical resistance PI-2 | Scumming-recovery (No. of copies) | Printing durability (No. of copies) | Overdevelopability 0.2 l | Overdevelopability 0.5 l |
|---|---|---|---|---|---|---|---|---|---|---|---|---|---|---|
| 1 | QD-1 | (i) | — | Succinic acid | 4.2 | A | A | 50 | o | o | 35 | Over 30,000 | 1.5 | 2.5 |
| 2 | QD-1 | (ii) | — | Glutaric acid | 4.3 | A | A | 45 | o | o | 40 | Over 30,000 | 1.5 | 2.5 |
| 3 | QD-1 | (iii) | — | Adipic acid | 4.4 | A | A | 45 | o | o | 37 | Over 30,000 | 1.5 | 2.0 |
| 4 | QD-1 | (i) | *3 | Ascorbic acid | 4.2 | A | A | 60 | o | o | 49 | Over 30,000 | 1.0 | 1.5 |
| 5 | QD-2 | (ii) | — | Merdrum acid | 5.1 | A | A | 45 | o | o | 40 | Over 30,000 | 1.5 | 2.0 |
| 6 | QD-2 | (iii) | *3 | Glutaric acid | 4.3 | A | A | 50 | o | o | 38 | Over 30,000 | 1.0 | 1.5 |
| 7 | QD-1 | (i) | — | Malonic acid | 2.8 | A | A | 50 | o | o | 41 | Over 30,000 | 1.5 | 2.0 |
| 8 | QD-1 | — | *4 | p-toluenesulfonic acid | below 1.0 | C | D | 90 | x | x | 97 | About 5,000 | 1.5 | 2.0 |
| 9 | QD-1 | — | *4 | Diphenyl phosphate | below 1.0 | C | D | 100 | x | x | 100 | About 5,000 | 1.5 | 2.0 |
| 10 | QD-2 | — | *4 | Picric acid | 0.7 | C | D | 100 | x | x | 101 | About 5,000 | 1.5 | 2.0 |
| 11 | QD-2 | (iii) | — | Picric acid | 0.7 | C | D | 100 | o | o | 112 | Over 30,000 | 1.5 | 2.5 |
| 12 | QD-2 | — | *4 | — | — | D | D | 120 | x | x | 115 | About 5,000 | 1.5 | 2.0 |
| 13 | QD-2 | — | *4 | 2,3-dinitrobenzoic acid | 1.9 | C | D | 90 | x | x | 110 | About 5,000 | 1.5 | 2.0 |
| 14 | QD-2 | — | *4 | Malonic acid | 2.8 | B | B | 80 | x | x | 80 | About 5,000 | 1.5 | 2.0 |

*1 o-quinonediazido compound:
QD-1: 1,2-naphthoquinonediazido-5-sulfonic acid-2,3,4-trihydroxybenzophenone ester.
QD-2: esterification product of pyrogallol-acetone condensate resin (Mw = 1,800) and 1,2-naphthoquinonediazido-5-sulfonyl chloride.
*2 Novolak resin
Co-condensate resin of m-cresol, p-cresol and formaldehyde.
*3 Added in an amount of 10% by weight of high-molecular weight compound.
*4 Added in the same amount as high-molecular compound of samples Nos. 1–7.
*5 Underdevelopability
A: No scumming.
B: Slight scumming occured.
C: Scumming occured noticeably.
D: Scumming occured excessively.
*6 Chemical resistance
o: No corrosion of image area was seen.
x: Extensive corrosion of image area was seen.
UPC: Immersed for 2 hours.
PI-2: Immersed for 30 minutes.
*7 UPC: Ultra Plate Cleaner.

In the above table, high-molecular weight compound (ii) is a compound of the formula:

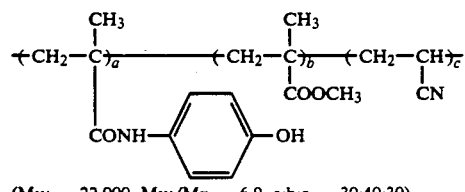

(Mw = 22,000, Mw/Mn = 6.9, a:b:c = 30:40:30), and high-molecular weight compound (iii) is a compound of the formula:

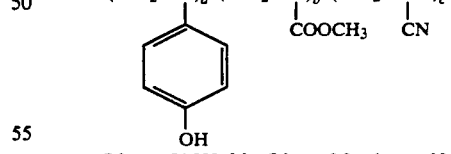

(Mw = 54,000, Mw/Mn = 8.2, a:b:c = 20:40:40).

As seen from Table 3, it is possible, with the photosensitive planographic printing plates of this invention, to obtain clear prints without causing disappearance of the dots at the highlights of the image area even after 30,000 copies have been printed. On the other hand, in the case of the printing plates prepared as comparative examples, except for Sample No. 11, ink adhesiveness at the image area deteriorated and also the dots at the highlights disappeared after cleaning of the plate surface on printing of 5,000 copies, making it impossible to obtain clear prints after printing of about 5,000 copies.

The printing plate of Sample No. 11 was also unsatisfactory in underdevelopability, sensitivity and scumming-recovery.

It was also found that the photosensitive planographic printing plates according to this invention were excellent in underdevelopability, sensitivity, chemical resistance and scumming-recovery.

EXAMPLE 7

An aluminum plate to be used as support for a planographic printing plate was made by following the procedure of Example 6.

This aluminum plate was rotary coated with a photosensitive coating solution (sensitizing solution 5) of the following composition and dried at 90° C. for 4 minutes to obtain a positive photosensitive planographic printing plate (Sample No. 15).

| Sensitizing solution 5 | |
|---|---|
| High-molecular weight compound (iv) | 48 parts (53.3 parts in the case of Sample No. 35) |
| Novolak resin (A) | 5.3 parts (53.3 parts in the case of Sample No. 36) |
| o-quinonediazido compound (QD-1) | 12 parts |
| Compound having the structural unit (II) or (III) (Emulgen 906) | 3.3 parts |
| Victoria Pure Blue BOH (made by Hodogaya Chemical Co., Ltd.) | 0.7 part |
| 2-trichloromethyl-5-($\beta$-(2'-benzofuryl)-vinyl)-1,3,4-oxadiazole | 1.3 parts |
| Methyl cellosolve | 975 parts |

Additional photosensitive planographic printing plate (Samples Nos. 16-36) were made by the same method as used for Sample No. 15 except that at least one of the components o-quinonediazido compound, novolak resin, high-molecular compound and compound having the structural unit (II) or (III) in said sensitizing solution was changed as shown in Table 4.

A step tablet for determining sensitivity (Eastman Kodak Step Tablet No. 2 a 21- step gray scale with a stepwise density difference of 0.15) was attached to each of said sample photosensitive planographic printing plates (Samples Nos. 15-36), and each sample was exposed at a light intensity of 8.0 mW/cm² by using a 2 KW metal halide lamp. They were then developed with the standard developer prepared by diluting SDR-1 6 times with water, at 25° C. for 40 seconds, whereby the non-image area was perfectly removed to give planographic printing plates.

In order to determine overdevelopability, there was prepared a developer having an excess developing capacity by adding a 4 times diluted solution of SDR-1R (a developer replenisher available from Konishiroku Photo Industries Co., Ltd.) to said standard developer. Said exposed samples were developed with this developer at 25° C. for 40 seconds, and their overdevelopability was judged by observing the increase of the number of solid steps in the step tablet in comparison with standard development. The smaller the increase of the number of solid steps, the better is overdevelopability.

For determining safe-light tolerance of each sample, it was exposed to white fluorescent light for 10 minutes of 15 minutes and then developed with the standard developer at 25° C. for 40 seconds, and the degree of corrosion at the exposed portion was examined.

Ball pen performance of each specimen was determined by making a drawing on the non-exposed portion with a Pilot ball pen, developing it with the standard developer at 25° C. for 60 seconds and visually judging the degree of corrosion of the drawing portion.

Chemical resistance of said samples was determined by examining their proofness against Ultra Plate Cleaner (made by A. B. C. Chemical Co., Ltd.) used as a cleaner for removing scums formed on the non-image area during printing. The image-formed printing plate was immersed in each of said treating solutions at room temperature for a predetermined period of time and then washed with water and the image area was compared with that before immersion to judge the degree of corrosion of the image area by the treating chemicals.

A printing test was conducted by using a press, in which ink adhesiveness was evaluated by the number of copies printed till the ink was perfectly transferred to the printing paper after start of printing.

The results are shown collectively in Table 4.

TABLE 4

| Sample No. | *1 o-quinonediazido compound | *2 Novolak resin | *3 High-molecular weight compound | *4 Compound having structure unit (II) or (III) | *5 Overdevelopability (Increase of the number of solid steps based on standard development) | | | *6 Safe-light tolerance | | *6 Ball pen performance | *6 Chemical resistance | Ink adhesiveness (No. of copies) |
|---|---|---|---|---|---|---|---|---|---|---|---|---|
| | | | | | Over 1 | Over 2 | Over 3 | 10 min | 15 min | | | |
| 15 | QD-1 | A | (iv) | Emulgen 906 | 1.0 | 2.0 | 2.5 | A | B | A | A | 3 |
| 16 | QD-1 | A | (iv) | Emulgen 910 | 1.0 | 1.5 | 2.5 | A | B | A | A | 4 |
| 17 | QD-1 | A | (iv) | Emulgen 920 | 1.0 | 1.5 | 2.0 | A | B | A | A | 4 |
| 18 | QD-1 | A | (iv) | Emulgen 930 | 1.0 | 2.0 | 2.5 | A | B | A | A | 5 |
| 19 | QD-1 | A | (iv) | Emulgen 950 | 1.0 | 1.5 | 2.0 | A | B | A | A | 4 |
| 20 | QD-1 | A | (iv) | Emulgen 120 | 1.0 | 1.5 | 2.5 | A | B | A | A | 3 |
| 21 | QD-1 | A | (iv) | Emulgen PP-250 | 1.0 | 1.5 | 2.5 | A | B | A | A | 3 |
| 22 | QD-1 | A | (iv) | Leodol TW-S 120 | 1.0 | 2.0 | 2.5 | A | B | A | A | 4 |
| 23 | QD-1 | A | (iv) | Leodol TW-O 106 | 1.0 | 1.5 | 2.0 | A | B | A | A | 4 |
| 24 | QD-1 | A | (iv) | Emanone 1112 | 1.0 | 1.5 | 2.5 | A | B | A | A | 3 |
| 25 | QD-1 | A | (iv) | Polyethylene glycol | 1.0 | 1.5 | 2.0 | A | B | A | A | 5 |
| 26 | QD-1 | A | (iv) | Tetraethylene glycol | 1.0 | 2.0 | 2.5 | A | B | A | A | 4 |
| 27 | QD-1 | A | (iv) | FC-430 | 1.0 | 1.5 | 2.0 | A | B | A | A | 3 |
| 28 | QD-1 | A | (iv) | Newpol BTE-60 | 1.0 | 1.5 | 2.0 | A | B | A | A | 5 |
| 29 | QD-1 | A | (iv) | Nikkol R-1020 | 1.0 | 1.5 | 2.5 | A | B | A | A | 4 |
| 30 | QD-3 | B | (iv) | Emulgen 920 | 2.0 | 3.0 | 5.0 | A | B | D | A | 4 |
| 31 | QD-4 | B | (iv) | Emulgen 920 | 1.5 | 3.0 | 5.5 | A | B | D | A | 3 |
| 32 | QD-5 | B | (iv) | Polyethylene glycol | 1.0 | 2.0 | 4.5 | A | B | C | A | 3 |

TABLE 4-continued

| 33 | QD-6 | B | (iv) | Polyethylene glycol | 1.0 | 1.5 | 4.5 | A | B | C | A | 4 |
| --- | --- | --- | --- | --- | --- | --- | --- | --- | --- | --- | --- | --- |
| 34 | QD-1 | A | (vi) | — | 1.5 | 3.0 | 4.5 | B | D | C | C | 4 |
| 35 | QD-1 | — | (iv) | Polyethylene glycol | 1.5 | 2.0 | 3.0 | A | B | A | A | 4 |
| 36 | QD-1 | B | (v) | Emulgen 920 | 1.5 | 2.5 | 5.0 | B | D | B | C | 3 |

In Table 4;
*1 o-quinonediazido compound:
QD-1: 1,2-naphthoquinonediazido-5-sulfonic acid-2,3,4-trihydroxybenzophenone ester,
QD-3: 1,2-naphthoquinonediazido-5-sulfonic acid-4-hydroxybenzoic acid ethyl ester,
QD-4: 1,2-naphthoquinonediazido-5-sulfonic acid-bisphenol A monoester, QD-5: 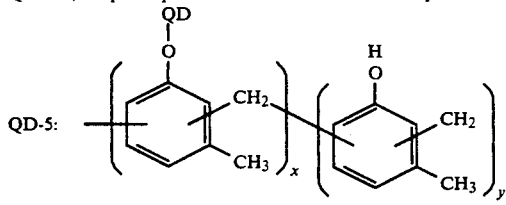

wherein QD = 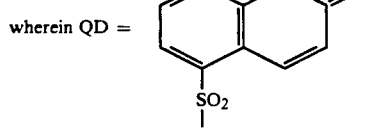

(x/y = 1/3; Mw of the resin before reacted with QD = 1,600), and

QD-6: 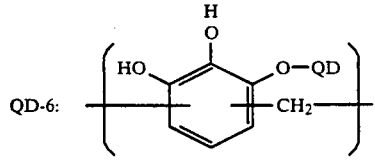

(Mw of the resin before reacted with QD = 1,000).
*2 Novolak resin:
Novolak resin (A): co-condensation polymerization resin of phenol, m-cresol, p-cresol and formaldehyde
(phenol:m-cresol:p-cresol (molar ratio) = 2.0:4.8:3.2; Mw = 7,000, Mw/Mn = 5.8),
Novolak resin (B): co-condensation polymerization resin of m-cresol, p-cresol and formaldehyde
(m-cresol:p-cresol (molar ratio) = 6:4; Mw = 8,000, Mw/Mn = 6.0).
*3 High-molecular weight compound:
High-molecular weight compound (iv):

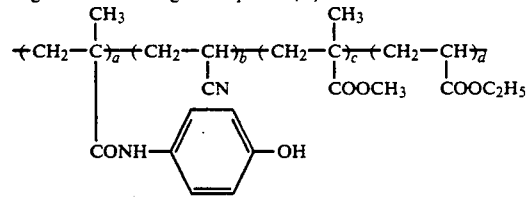

(Mw = 20,000, Mw/Mn = 2.1, a:b:c:d = 30:30:36.5:3.5),
High-molecular weight compound (v):

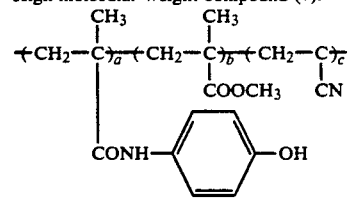

(Mw = 22,000, Mw/Mn = 6.9, a:b:c = 30:40:30),
High-molecular weight compound (vi):

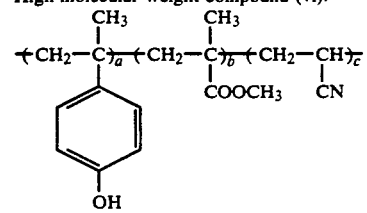

(Mw = 54,000, Mw/Mn = 8.2, a:b:c = 20:40:40).
*4 Compound having structural unit (II) or (III):

TABLE 4-continued

Emulgen 120 (made by Kao Co., Ltd.): polyoxyethylene lauryl ether,
Emulgen 906 (Kao)
Emulgen 910 (Kao)
Emulgen 920 (Kao)    } polyoxyethylene nonylphenyl ether,
Emulgen 930 (Kao)
Emulgen 950 (Kao)
Emulgen PP-250 (Kao): oxyethylene-oxypropylene block copolymer,
Leodol TW-S 120 (Kao): polyoxyethylene sorbitan monostearate,
Leodol TW-O 106 (Kao): polyoxyethylene sorbitan monooleate,
Emanone 1112 (Kao): polyethylene glycol monolaurate,
Newpol BPE 100 (made by Sanyo Kasei Kogyo KK):

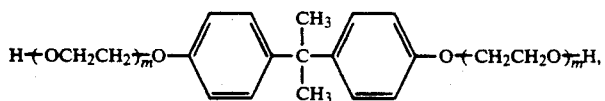

Nikkol R-1020 (made by Nikko Chemicals Co., Ltd.): polyoxyethylene nonylphenylformaldehyde condensate,
Polyethylene glycol (made by Kanto Chemical Co., Ltd.): polyethylene glycol #2000, and
FC-430 (made by Sumitomo 3M).
*5 Overdevelopability: Data obtained by carrying out development with the developers prepared by adding
SDR-1R (diluted 4 times) in amounts shown below to 9.0 liters of standard developer,
Over 1: 0.2 liter; Over 2: 0.5 liter; Over 3: 1.0 liter.
*6 Safe-light tolerance, ballpen performance and chemical resistance:
A: No corrosion of image area was seen,
B: Image area was slightly corroded,
C: Image area was noticeably corroded, and
D: Image area was heavily corroded.

It is seen from Table 4 that the photosensitive planographic printing plate samples containing an o-quinonediazido compound of this invention, a novolak resin, a high molecular weight compound of this invention and a compound having the structural unit (II) or (III) have excellent overdevelopability, safe-light tolerances, ball pen performance and ink adhesiveness as well as high chemical resistance.

EFFECTS OF THE INVENTION

As described above, the photosensitive planographic printing plate according to this invention has good UV ink suitability, great latitude in development, excellent ball pen performance and high chemical resistance and is also provided with fine sensitivity.

What is claimed is:

1. A positive photosensitive planographic printing plate comprising a support with a photosensitive layer thereon, said photosensitive layer consisting essentially of in admixture:
   (A) 5 to 50% by weight of a photosensitive ester of o-naphthoquinonediazidosulfonic acid and a polyhydroxybenzophenone; and
   (B) 50 to 95% by weight of a high-molecular weight compound comprising the structural unit represented by the general formula (I):

$$\{CR^1R^2CR^3\}\atop{|\atop (CONR^4)_m-(X)_n-Y-OH}} \quad (I)$$

wherein $R^1$ and $R^2$ represent independently a hydrogen atom, a halogen atom, a alkyl group, an aryl group or a carboxyl group; $R^3$ represents a hydrogen atom, a halogen atom, an alkyl group or an aryl group; $R^4$ represents a hydrogen atom, an alkyl group, an aryl group or an aralkyl group; Y represents an aromatic group which may be substituent(s); X represents a divalent organic group linking the nitrogen atom and a carbon atom of said aromatic group; m represents an integer of 0 or 1; and n represents an integer from 0 to 5.

2. A positive photosensitive planographic printing plate according to claim 1, wherein said polyhydroxybenzophenone is dihydroxybenzophenone, trihydroxybenzophenone, tetrahydroxybenzophenone, pentahydroxybenzophenone, octahydroxybenzophenone or a derivative thereof.

3. A positive photosensitive printing plate according to claim 1, wherein the formula (I) $R^1$ and $R^2$ represent independently a hydrogen atom, an alkyl group or a carboxyl group, $R^3$ represents a hydrogen atom, a halogen atom or an alkyl group, $R^4$ represents a hydrogen atom or an alkyl group, Y represents a phenylene or a naphthylene group which may have substituent(s), X represents an alkylene group, m represents an integer of 0 or 1, and n is an integer from 0 to 3.

4. A positive photosensitive planographic printing plate according to claim 1, wherein said high-molecular weight compound (B) has a weight-average molecular weight of 5,000 to 100,000 and contains at least 10% by mole of the structural unit represented by the formula (I).

5. A positive photosensitive planographic printing plate according to claim 1, wherein said high-molecular weight compound (B) contains the structural unit constituted by one or more compounds selected from the group consisting of methacrylic acids, acrylic acids, esters of aliphatic monocarboxylic acids and nitriles.

6. A positive photosensitive planographic printing plate according to claim 1, wherein said photosensitive layer further contains a compound having at least one of the following structural units (II) or (III):

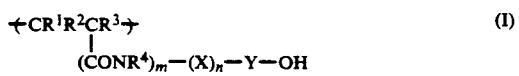

wherein t is an integer from 2 to 5,000.

7. A positive photosensitive planographic printing plate comprising a support with a photosensitive layer thereon, said photosensitive layer consisting essentially of in admixture:

(A) 5 to 50% by weight of a photosensitive ester of o-naphthoquinonediazidosulfonic acid and a polyhydroxybenzophenone;

(B) 45 to 95% by weight of a high-molecular weight compound comprising the structural unit represented by the general formula (I):

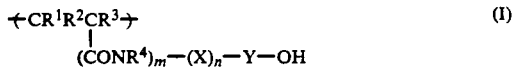
(I)

wherein $R^1$ and $R^2$ represent independently a hydrogen atom, a halogen atom, or an alkyl, an aryl or a carboxyl group; $R^3$ represents a hydrogen atom, a halogen atom, or an alkyl or an aryl group; $R^4$ represents a hydrogen atom, or an alkyl, an aryl or an aralkyl group; Y represents an aromatic group which may have substituent(s); X represents a divalent organic group linking the nitrogen atom and a carbon atom of said aromatic group; m represents an integer of 0 or 1; and n represents an integer of 0 to 5; and (C) 0.01 to 50% by weight of novolak resin.

8. A positive photosensitive planographic printing plate according to claim 7, wherein said novolak resin (C) is a resin obtained by co-condensation polymerization of at least one member selected from the group consisting of phenol, m-cresol, o-cresol and p-cresol, with formaldehyde.

9. A positive photosensitive planographic printing plate according to claim 7, wherein said novolak resin (C) has a weight-average molecular weight of 1,000 to 30,000 and a number-average molecular weight of 300 to 7,500.

10. A positive photosensitive planographic printing plate according to claim 7, wherein said photosensitive layer further contains a compound having at least one of the following structural units (II) and (III):

wherein t is an integer from 2 to 5,000.

11. Positive photosensitive planographic printing plate comprising a support with a photosensitive layer thereon said photosensitive layer consisting essentially of in admixture:

(A) 5 to 50% by weight of a photosensitive ester of o-naphthoquinonediazidosulfonic acid and a polyhydroxybenzophenone;

(B) 50 to 90% by weight of a high-molecular weight compound comprising the structural unit represented by the general formula (I):

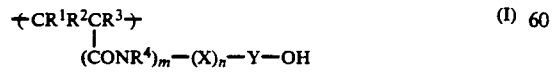
(I)

wherein $R^1$ and $R^2$ represent independently a hydrogen atom, a halogen atom, or an alkyl group, an aryl group or a carboxyl group; $R^3$ represents a hydrogen atom, a halogen atom, an alkyl group or an aryl group; $R^4$ represents a hydrogen atom, an alkyl group, an aryl group or an aralkyl group; Y represents an aromatic group which may have substituent(s); X represents a divalent organic group linking the nitrogen atom and a carbon atom or said aromatic group; m represents an integer of 0 or 1; and n represents an integer from 0 to 5; l and (D) 0.05 to 10% by weight of an organic acid having a pKa value of 2 or greater.

12. A positive photosensitive planographic printing plate according to claim 11, wherein said organic acid (D) has a pKa value of 3.0 to 9.0.

13. A positive photosensitive planographic printing plate according to claim 11, wherein said photosensitive layer further contains a compound having at least one of the following structural units (II) and (III):

wherein t is an integer from 2 to 5,000.

14. A positive photosensitive planographic printing plate according to claim 11, wherein said photosensitive layer further contains a novolak resin (C).

15. A positive photosensitive planographic printing plate according to claim 14, wherein said photosensitive layer further contains a compound having at least one of the following structural units (II) and (III):

wherein t is an integer from 2 to 5,000.

16. A positive photosensitive planographic printing plate according to any of claims 6, 10, 13 or 15, wherein said photosensitive layer contains 0.2 to 10% by weight of a compound having at least one of the of following structural units (II) and (III):

wherein t is an integer from 2 to 5,000.

17. A positive photosensitive planographic printing plate according to any of claims 6, 10, 13 or 15, wherein the remainder of said photosensitive layer is at least one selected from image-additives after exposure, pigments, surface active agents, sensitizers, plasticizers and additives having a hydrophobic group.

* * * * *